(12) United States Patent
Reznicek et al.

(10) Patent No.: US 11,901,449 B2
(45) Date of Patent: Feb. 13, 2024

(54) SERIES CONNECTED STACKED VERTICAL TRANSISTORS FOR HIGH VOLTAGE APPLICATIONS

(71) Applicant: INTERNATIONAL BUSINESS MACHINES CORPORATION, Armonk, NY (US)

(72) Inventors: Alexander Reznicek, Troy, NY (US); Bahman Hekmatshoartabari, White Plains, NY (US); Tak H. Ning, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 481 days.

(21) Appl. No.: 17/134,632

(22) Filed: Dec. 28, 2020

(65) Prior Publication Data

US 2021/0119045 A1  Apr. 22, 2021

Related U.S. Application Data

(62) Division of application No. 16/365,084, filed on Mar. 26, 2019, now Pat. No. 10,957,797.

(51) Int. Cl.
| | |
|---|---|
| *H01L 29/78* | (2006.01) |
| *H01L 29/06* | (2006.01) |
| *H01L 29/423* | (2006.01) |
| *H01L 27/088* | (2006.01) |
| *H01L 29/786* | (2006.01) |
| *H01L 29/66* | (2006.01) |

(52) U.S. Cl.
CPC ........ *H01L 29/7835* (2013.01); *H01L 27/088* (2013.01); *H01L 29/0653* (2013.01);
(Continued)

(58) Field of Classification Search
CPC .............. H01L 29/7835; H01L 27/088; H01L 29/0653; H01L 29/42392; H01L 29/66666;
(Continued)

(56) References Cited

U.S. PATENT DOCUMENTS

| | | |
|---|---|---|
| 8,063,450 B2 | 11/2011 | Wernersson et al. |
| 8,837,204 B2 | 9/2014 | Asa |

(Continued)

FOREIGN PATENT DOCUMENTS

WO  2012/084751 A1  6/2012

OTHER PUBLICATIONS

List of IBM Patents or Patent Applications Treated as Related dated Dec. 23, 2020, 2 pages.

(Continued)

*Primary Examiner* — Tong-Ho Kim
(74) *Attorney, Agent, or Firm* — Tutunjian & Bitetto, P.C.; Daniel Morris

(57) ABSTRACT

A method of forming an electrical device that includes forming a multilayered fin composed of a first source/drain layer for a first transistor, a first channel layer for the first transistor, a common source/drain layer for the first transistor and a second transistor, a second channel layer for the second transistor and a second source/drain layer for the second transistor. A common spacer is formed on the common source/drain layer that separates a first opening to the first channel layer from a second opening to the second channel layer. Gate structures are then formed in the first and second openings.

19 Claims, 4 Drawing Sheets

(52) U.S. Cl.
CPC .. *H01L 29/42392* (2013.01); *H01L 29/66666*
(2013.01); *H01L 29/78642* (2013.01); *H01L*
*29/78696* (2013.01)

(58) Field of Classification Search
CPC ......... H01L 29/78642; H01L 29/78696; H01L
21/823475; H01L 21/823481; H01L
21/823487; H01L 29/41741; H01L
29/665; H01L 29/66545; H01L 29/7827
USPC ....................................................... 257/213
See application file for complete search history.

(56) References Cited

U.S. PATENT DOCUMENTS

| | | |
|---|---|---|
| 9,048,329 B2 | 6/2015 | Kim et al. |
| 2010/0295134 A1 | 11/2010 | Nagashima et al. |
| 2017/0250115 A1* | 8/2017 | Guo .................... H01L 29/4238 |
| 2018/0069131 A1 | 3/2018 | Balakrishnan et al. |
| 2018/0342507 A1 | 11/2018 | Xie et al. |

OTHER PUBLICATIONS

List of IBM Patents or Patent Applications Treated as Related dated Dec. 28, 2020, 2 pages.
Cai, J. et al., "SOI series MOSFET for embedded high voltage applications and Soft-error immunity" 2008 IEEE International SOI Conference (Oct. 2008) p. 1-2.
Sacchetto, D et al., "Fabrication and Characterization of Vertically Stacked Gate-All-Around Si Nanowire FET Arrays" IEEE (Oct. 2009) pp. 1-4.

\* cited by examiner

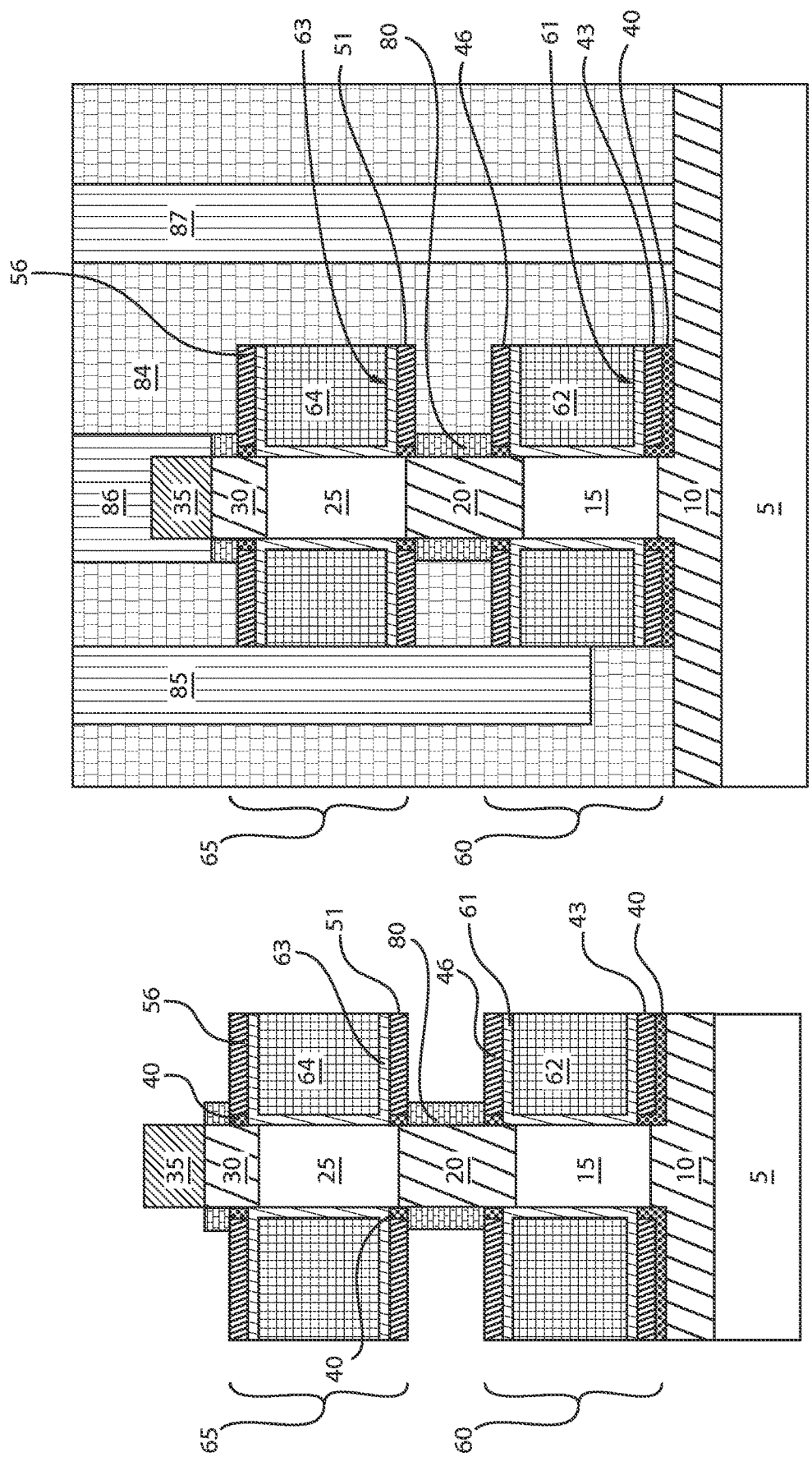

SERIES CONNECTED STACKED VERTICAL TRANSISTORS FOR HIGH VOLTAGE APPLICATIONS

BACKGROUND

Modern integrated circuits are made up of literally millions of active devices such as transistors and memory devices. With the continuing trend towards miniaturization of integrated circuits (ICs), there is a need for transistors to have higher drive currents with increasingly smaller dimensions. For decades, semiconductor manufacturing was driven by Moore's Law and planar transistor architecture. This provided a predictable, self-sustaining roadmap for transistor cost scaling and well-defined interfaces where each individual process/layer could follow its own technology trajectory independently. However, as the industry scales to provide sub-20 nm nodes and other popular device architectures, such as FinFET and vertical devices are employed, new processes are required, and new approaches for semiconductor manufacturing are being explored and implemented.

SUMMARY

In accordance with an embodiment of the present disclosure, a method of forming a semiconductor device is provided. The method may begin with forming a multilayered fin composed of a first source/drain layer for a first transistor, a first channel layer for the first transistor, a common source/drain layer for the first transistor and a second transistor, a second channel layer for the second transistor and a second source/drain layer for the second transistor. A common spacer is formed on the common source/drain layer that separates a first opening to the first channel layer from a second opening to the second channel layer. Gate structures may be formed in the first and second openings. It is noted that the gate structures may be formed using gate first methods or by employing a replacement gate process to provide a gate last method.

In another aspect of the present disclosure, an electrical device is provided that includes two vertically stacked transistors, in which each of the transistors is a vertically orientated transistor, such as a VFET, and the two transistors are connected in series through a common source/drain region. In one embodiment, the electrical device includes a first vertical field effect transistor (VFET) including a first source/drain region present on a supporting substrate, a first channel region in direct contact with the first source/drain region and a common source/drain region. The electrical device may further include a second vertical field effect transistor including the common source/drain region, a second channel region present on the common/source drain region, and a second source/drain region present on the second channel region.

In another aspect, the electrical device may further include a silicide region that provides a low resistance pathway between the series connected first and second vertically orientated devices that are stacked atop one another. In one embodiment, the electrical device includes a first vertical field effect transistor (VFET) including a first source/drain region present on a supporting substrate, a first channel region in direct contact with the first source/drain region and a common source/drain region. A first gate region is present on the first channel region. The electrical device may further include a second vertical field effect transistor including the common source/drain region, a second channel region present on the common/source drain region, and a second source/drain region present on the second channel region. A second gate region is present on the second channel region. A metal semiconductor alloy region is present extending along a sidewall of the common source/drain region extending from a first spacer on the first gate region to a second spacer on the second gate region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 5 is a side cross-sectional view depicting one embodiment of forming a metal semiconductor alloy that is present extending along a sidewall of the common source/drain region extending from a first spacer on the first gate region to a second spacer on the second gate region.

FIG. 6 is a side cross-sectional view depicting forming a gate contact, contact to the drain region and contact to the source region of the device, in accordance with one embodiment of the present disclosure.

DETAILED DESCRIPTION

Figure 2:
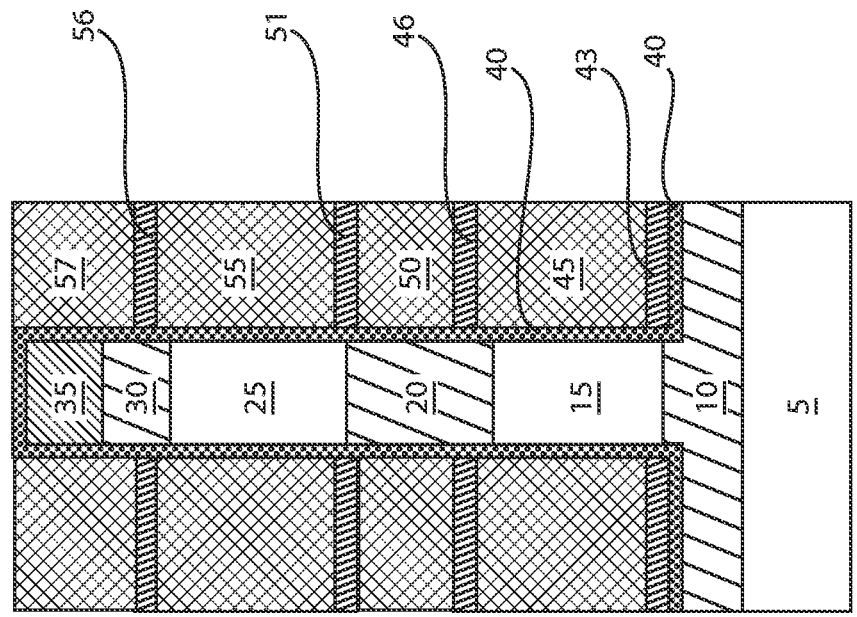
FIG. 2 is a side cross-sectional view of one embodiment of forming a conformal dielectric liner on the fin structure including the material layers for the two vertically stacked transistors, and forming a sacrificial gate structure on the portions of the conformal dielectric layer that is present on each of the channel regions for the two vertically stacked transistors that is depicted in FIG. 1.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structures described herein provide a vertical transistor, such as a vertical field effect transistor. As used herein a "field effect transistor" is a transistor in which output current, i.e., source-drain current, is controlled by the voltage applied to the gate. A field effect transistor has three terminals, i.e., gate, source and drain. A "gate structure" means a structure used to control output current (i.e., flow of carriers in the channel) of a semiconducting device through electrical fields. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. Because the source region and the drain region are both provided by doped regions on opposing sides of the channel of the device, and their function as a source region or a drain region is impacted by the bias applied to these regions in the final device structure, the term "source/drain region" is suitable for describing these doped regions in the absence of the bias that designates their type.

A "vertical" FET (VFET) semiconductor device has the drain, channel, and source device components arranged perpendicular to the plane of the substrate surface, which is referred to as a vertical stack. A vertically stacked FET can have a longer gate length (i.e., height) and larger dielectric spacer than a horizontal (i.e., having the drain, fin channel, and source device components arranged parallel with the plane of the substrate surface) FET having comparable contact gate pitch.

Vertical transistors are attractive candidates for 5 nm node and greater due to their potential of better density scaling and allowing relaxed gate lengths to better control electrostatics. Vertical logic field effect transistors (FETs) are typically designed for use with a supply voltage ($V_{dd}$), i.e., drain region supply voltage, of less than 1 volt. However, a larger supply voltage ($V_{dd}$) is typically needed for input/output (I/O) devices. Stacking vertical field effect transistors, e.g., by connecting them in series, and operating as a single transistor, enables vertical logic FETs to operate with a significantly larger power supply voltage, while using the same small footprint which makes vertical field effect transistors (VFETs) attractive.

In some embodiments, the methods and structures described herein provide for forming a stacked vertical transistor (VTFET) with two VTFET to form high voltage vertical field effect transistors (VFETs). In some embodiments, the two stacked vertical field effect transistors, e.g., NFETs, are in series with a common drain region, and connected gates, as well as connected source regions, e.g., the source regions may be connected by wiring. In some examples, in which the fin length is substantially greater than the contact pitch, for a given area, the drive current of the device can be almost doubled. The internal connection between the two stacked field effect transistors (FET's) source/drain epitaxy with an optional silicide strap can reduce the resistance of the device. Some embodiments of structures disclosed herein, are now described in more detail with reference to FIGS. 1-6.

Figure 1:
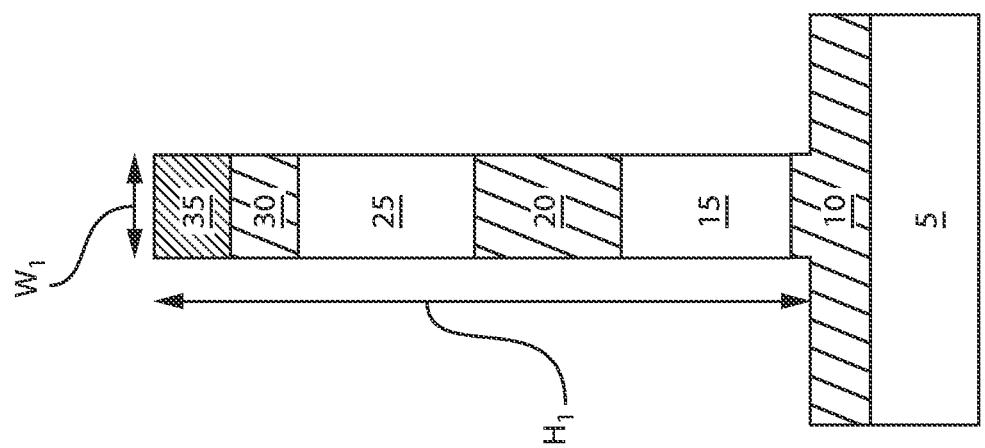
FIG. 1 is a side cross-sectional view of patterning a material stack to provide a fin structure that is employed in a method of forming two vertically stacked transistors that share a common source/drain region, in accordance with an embodiment of the present disclosure.

FIG. 1 depicts one embodiment of patterning a material stack to provide a fin structure that is employed in a method of forming two vertically stacked transistors that share a common source/drain region. As used herein, the term "drain" and/or "drain region" means a doped region in semiconductor device located at the end of the channel, in which carriers are flowing out of the transistor through the drain. As used herein, the term "source" and/or "source region" is a doped region in the semiconductor device, in which majority carriers are flowing into the channel. Because the source region and the drain region are both provided by doped regions on opposing sides of the channel of the device, and their function as a source region or a drain region is impacted by the bias applied to these regions in the final device structure, the term "source/drain region" is suitable for describing these doped regions in the absence of the bias that designates their type. The term "common", as used in the term "common source/drain region" means that a single source/drain region, e.g., a single conductivity type doped region, provides a source/drain for two devices simultaneously.

The method may begin with forming a multilayered fin composed of a first source/drain layer 10 for a first transistor, a first channel layer 15 for the first transistor, a common source/drain layer 20 for the first transistor and a second transistor, a second channel layer 25 for the second transistor and a second source/drain layer 30 for the second transistor. The first source/drain layer 10 may be present on a supporting substrate 5.

The supporting substrate 5 can be provided by a bulk semiconductor substrate. The bulk semiconductor substrate may be composed of a type IV semiconductor. Examples of type IV semiconductors that are suitable for use as the base material for the supporting substrate 5 may include silicon (Si), crystalline silicon (c-Si), monocrystalline silicon, germanium, silicon germanium (SiGe), silicon doped with carbon (Si:C), silicon germanium doped with carbon (SiGe:C) and a combination thereof, and similar semiconductors, e.g., semiconductor materials including at least one element from Group IVA (i.e., Group 14) of the Periodic Table of Elements. In other examples, the supporting substrate 5 may be composed of a type III-V semiconductor material. Examples of type III-V materials can include gallium arsenic (GaAs). Although the supporting substrate 5 is depicted as a bulk substrate, in other embodiments, the supporting substrate 5 may be a semiconductor on insulator (SOI) substrate.

The material layers for the multilayered fin may be formed on the supporting substrate using an epitaxial deposition process. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Each of the first source/drain layer 10, the first channel layer 15, the common source/drain layer 20 for the first transistor, and the second channel layer 25 as well as the second source/drain region 30, for the second transistor, may have a based material be composed of a type IV or type III-V semiconductor material. By "type IV semiconductor" it is meant that the semiconductor material includes at least one element from Group IVA (i.e., Group 14) of the Periodic Table of Elements. Examples of type IV semiconductor materials that are suitable for the multilayered fin structure include silicon (Si), germanium (Ge), silicon germanium (SiGe), silicon doped with carbon (Si:C), silicon germanium doped with carbon (SiGe:C) and a combination thereof. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

A number of different sources may be used for the deposition of the semiconductor material that forms the first source/drain layer 10, the first channel layer 15, the common source/drain layer 20, the second channel layer 25 and the second source/drain region 30. In some embodiments, in which the semiconductor material that forms the first source/drain layer 10, the first channel layer 15, the common source/drain layer 20, the second channel layer 25 and the second source/drain region 30 is composed of silicon, the silicon gas source for epitaxial deposition may be selected from the group consisting of hexachlorodisilane ($Si_2Cl_6$), tetrachlorosilane ($SiCl_4$), dichlorosilane ($SiH_2Cl_2$), trichlorosilane ($Cl_3SiH$), and combinations thereof. In some embodiments, in which the semiconductor material that forms the first source/drain layer 10, the first channel layer 15, the common source/drain layer 20, the second channel layer 25 and the second source/drain region 30 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that forms the first source/drain layer 10, the first channel layer 15, the common source/drain layer 20, the second channel layer 25 and the second source/drain region 30 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

In some embodiments, the epitaxial deposition process provides that the epitaxially formed materials have a similar crystalline structure as their deposition surface. For example, if the supporting substrate is crystalline, e.g., monocrystalline, single crystalline, or polycrystalline, the epitaxially formed material layers for the first source/drain layer 10, the first channel layer 15, the common source/drain layer 20, the second channel layer 25 and the second source/drain region 30 can also be crystalline, e.g., monocrystalline, single crystalline, or polycrystalline.

The first source/drain layer 10 for the first transistor, the common source/drain region 20 and the second source/drain layer 30 may each be doped to a same conductivity type. The term "conductivity type" denotes whether the devices which the region have a p-type conductivity or an n-type conductivity. As used herein, "P-type" refers to the addition of impurities to an intrinsic semiconductor that creates deficiencies of valence electrons, such as the addition of boron, aluminum, or gallium to a type IV semiconductor, such as silicon. As used herein, "N-type" refers to the addition of impurities to an intrinsic semiconductor that contribute free electrons, such as the addition of antimony, arsenic, or phosphorous to a type IV semiconductor, such as silicon.

The first channel region 15 and the second channel region 25 may each be composed of undoped semiconductor material. By undoped it can be meant that the material is intrinsic. An intrinsic semiconductor, also called an undoped semiconductor or i-type semiconductor, is a pure semiconductor without any significant dopant species present. The number of charge carriers is therefore determined by the properties of the material itself instead of the amount of impurities. In some examples, intrinsic semiconductors the number of excited electrons and the number of holes are equal: n=p.

The first source/drain layer 10 for the first transistor, the common source/drain region 20 and the second source/drain layer 30 may each be doped to a same conductivity type. The conductivity type for each of the first source/drain layer 10 for the first transistor, the common source/drain region 20 and the second source/drain layer 30 may be provided via in situ doping. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. The n-type gas dopant source gas for a type IV semiconductor may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type gas dopant source gas for a type IV semiconductor may include diborane.

In one example, the first source/drain layer 10 for the first transistor may have a base material composed of silicon (Si) or silicon germanium (SiGe). In one example, the first channel layer 15 for the first transistor may have a p-type conductivity and a material composed of boron in situ doped silicon (Si) or boron in situ doped silicon germanium (SiGe). In one example, the common source/drain layer 20 for the first transistor and the second transistor may have a p-type conductivity and a material composed of boron in situ doped silicon (Si) or boron in situ doped silicon germanium (SiGe). In one example, the second channel layer 25 for the second transistor may be intrinsic and have a material composed of silicon (Si) or silicon germanium (SiGe). In one example, the second source/drain layer 30 for the second transistor may be intrinsic and have a material composed of silicon (Si) or silicon germanium (SiGe).

The above described epitaxial deposition process is employed to provide a material stack of the layers for the first source/drain layer 10, the first channel layer 15, the common source/drain layer 20, the second channel layer 25 and the second source/drain layer 30, wherein the epitaxially formed material stack is patterned and etched to provide a fin structure.

Still referring to FIG. 1, in one embodiment, the method may continue with forming a mask 35 on the above mentioned epitaxially formed material stack. More specifically, a layer of the dielectric material is deposited atop the second source/drain layer 30 to provide the mask 35. The material layer that provides the mask 35 may be composed of a nitride, oxide, oxynitride material, and/or any other suitable dielectric layer. The mask 35 may comprise a single layer of dielectric material or multiple layers of dielectric materials. The material layer that provides the mask 35 can be formed by a deposition process, such as chemical vapor deposition and/or atomic layer deposition.

In one embodiment, a photolithography and etch process sequence is applied to the mask layer for the dielectric fin cap for patterning the material stack that provides the fin. Specifically, in one example, a photoresist mask (not shown) is formed overlying the layer of the dielectric material that provides mask 35 (also referred to as dielectric fin cap), in which the portion of the dielectric material that is underlying the photoresist mask provides the dielectric fin cap, and the portion of the epitaxially formed material stack provides the layers for the multilayered fin structure that is depicted in FIG. 1. The exposed portions of the dielectric material that provides mask 35 (also referred to as dielectric fin cap) and the epitaxially formed material stack, which are not protected by the photoresist mask, are removed using a etch process, e.g., selective etch process. To provide the photoresist mask, a photoresist layer is first positioned on the layer of the dielectric material that provides the mask 35. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the mask 35 followed by removing the unprotected portion of the epitaxially formed material stack. In some embodiments, at least a portion of the etch process is selective to the first source/drain layer 10 for the first transistor.

For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

The fin structure depicted in FIG. 1 may have a height $H_1$ ranging from 5 nm to 200 nm. In another embodiment, the fin structure has a height $H_1$ ranging from 10 nm to 100 nm. In one example, the fin structure has a height $H_1$ ranging from 20 nm to 50 nm. The fin structure may have a width $W_1$ of less than 20 nm. In another embodiment, the fin structure has a width $W_1$ ranging from 3 nm to 8 nm.

Following patterning of the fin structure, the first source/drain layer 10 may also be referred to as the first source/drain region 10, the first channel layer 15 may also be referred to as the first channel region 15, the common source/drain layer 20 may also be referred to as the common source/drain region 20, the second channel layer 25 may also be referred to as the second channel region 25, and the second source/drain layer 30 may also be referred to as the second source/drain region 30.

FIG. 2 depicts one embodiment of forming a conformal dielectric liner on the fin structure including the material layers for the two vertically stacked transistors, and forming a sacrificial gate structure on the portions of the conformal dielectric layer that is present on each of the channel regions for the two vertically stacked transistors that is depicted in FIG. 1.

FIG. 2 depicts one embodiment of forming a conformal dielectric liner 40 on the fin structure that is depicted in FIG. 1 that includes the material layers for the two vertically stacked transistors. The term "conformal" denotes a layer having a thickness that does not deviate from greater than or less than 30% of an average value for the thickness of the layer. The conformal dielectric liner 40 may be composed of an oxide containing dielectric, such as silicon oxide ($SiO_2$) and/or silicon oxynitride. In one embodiment, the conformal dielectric liner 40 may have a thickness of 1 nm to 5 nm, however this example is not intended to be limiting, as other thicknesses have also been contemplated.

The conformal dielectric liner 40 may be blanket deposited, and is present on the vertically orientated surfaces, e.g., sidewall surfaces, of the fin structure, as well as on the horizontally orientated surfaces, e.g., top surface of the mask 35, and exposed upper surface of first source/drain layer 10, for the structure depicted in FIG. 1. The conformal dielectric liner 40 may be deposited using a chemical vapor deposition process, such as plasma enhanced chemical vapor deposition (PECVD). In other embodiments, the conformal dielectric liner 40 may be formed by oxidation and/or thermal oxidation, e.g., low temperature oxidation.

FIG. 2 also depicts forming a sacrificial gate structure 45, 55 on the portions of the conformal dielectric layer 40 that is present on each of the channel regions 15, 25 for the two vertically stacked transistors that is depicted in FIG. 1. As used herein, the term "sacrificial gate structure 30" denotes a sacrificial structure that dictates the geometry and location of the later formed functioning gate structure. The sacrificial material that provides the sacrificial gate structure 30 may be composed of any material that can be etched selectively to at least one of the conformal dielectric layer 40 or the channel regions 15, 25. In one embodiment, the sacrificial material that provides the sacrificial gate structure 45, 50 may be composed of a silicon-containing material, such as polysilicon. Although, the sacrificial gate structure 45, 50 is typically composed of a semiconductor material, the sacrificial gate structure 45, 50 may also be composed of a dielectric material, such as an oxide, nitride or oxynitride material, or amorphous carbon.

In some embodiments, before forming the sacrificial gate structure 45, 55, a first spacer 43 is formed on the exposed upper surface of the first source/drain region 10 that extends from the sidewall of the fin structure. The first spacer 43 may be deposited using a directional deposition process. For example, the first spacer 43 may be formed using chemical vapor deposition (CVD), such as high density plasma chemical vapor deposition (HPDCVD) or a combination thereof. In other embodiments, the directional deposition process may be provided by ion beam sputtering, gas cluster ion beam (GCIB), or ion assisted deposition. The first spacer 43 can be composed of silicon nitride, however other dielectric materials, such as other nitrides, may be composed for the composition of the first spacer 43.

The thickness of the first spacer 43 is selected to provide that the subsequently formed gate conductor of the first functional gate structure is electrically isolated form the horizontal surfaces of the first source/drain layer 10. The thickness of the first spacer 43 is also selected to provide that the subsequently formed first sacrificial gate structure 45 is present along the sidewall of the portion of the fin structure that provides the first channel layer 15 for the first transistor.

In some embodiments, following the formation of the first spacer 43, a material layer for the first sacrificial gate structure 45 can be formed directly atop the first spacer 43. The first sacrificial gate structure 45 may be composed of a semiconductor material, such as a silicon containing semiconductor material, e.g., amorphous silicon or polysilicon. Similar to the first spacer 43, the first sacrificial gate structure 45 is deposited using directional deposition, such as chemical vapor deposition, e.g., high density plasma chemical vapor deposition (HDPCVD), ion beam sputtering, gas cluster ion beam (GCIB), ion assisted deposition and/or physical vapor deposition. The thickness of the material layer for the first sacrificial gate structure 45 is selected to provide that the later formed functional gate structure that replaces the first sacrificial gate structure 45 is positioned on the first channel layer 15 of the first transistor.

Still referring to FIG. 2, a multi-layered common spacer 46, 50, 51 can then be formed atop the first sacrificial gate structure 45. A first side portion 46 (e.g., lower portion) of the multi-layered common spacer 46, 50, 51 may be similar to the first spacer 43. For example, the first side portion 46 of the multi-layered common spacer 46, 50, 51 may be composed of a nitride, such as silicon nitride. A middle portion 50 of the multi-layered common spacer 46, 50, 51 may be composed of a same or different dielectric than the first and second portions 46, 51 of the multi-layered common spacer 46, 50, 51. For example, when the first side portion 46 and the second side portion 51 of the multi-layered common spacer 46, 50, 51 is composed of a nitride, such as silicon nitride, the middle portion 50 of the multi-layered common spacer 46, 50, 51 is composed of an oxide, such as silicon oxide. In some embodiments, the middle side portion 50 of the multi-layered common spacer 46, 50, 51 is removed to provide a metal semiconductor alloy extending along the sidewall of the common source/drain region. The second side portion 51 (e.g., upper portion) of the multi-layered common spacer 46, 50, 51 may be similar to the first side portion 46 of the multilayered common spacer 46, 50, 51. For example, the second side portion 51 of the multi-layered common spacer 46, 50, 51 may be composed of a nitride, such as silicon nitride. The thickness of the multi-layered common spacer 46, 50, 51 is selected to provide that the multi-layered common spacer 46, 50, 51 extends along an entire sidewall of the common source/drain region 20.

The multi-layered common spacer 46, 50, 51 is deposited using directional deposition, such as chemical vapor deposition, e.g., plasma enhanced chemical vapor deposition (PECVD) and/or high density plasma chemical vapor deposition (HDPCVD), ion beam sputtering, gas cluster ion beam (GCIB), ion assisted deposition and/or physical vapor deposition.

In some embodiments, following the formation of the multi-layered common spacer 46, 50, 51, a material layer for the second sacrificial gate structure 55 can be formed directly atop the multi-layered common spacer 46, 50, 51. The second sacrificial gate structure 55 may be composed of a semiconductor material, such as a silicon containing semiconductor material, e.g., amorphous silicon or polysilicon. The second sacrificial gate structure 55 is deposited using directional deposition, such as chemical vapor deposition, e.g., high density plasma chemical vapor deposition (HDPCVD), ion beam sputtering, gas cluster ion beam (GCIB), ion assisted deposition and/or physical vapor deposition. The thickness of the material layer for the second sacrificial gate structure 55 is selected to provide that the later formed functional gate structure that replaces the second sacrificial gate structure 55 is positioned on the second channel layer 25 of the second transistor.

Referring to FIG. 2, a second spacer 56 is formed on the second sacrificial gate structure 55. The second spacer 56 may be deposited using a directional deposition process. For example, the second spacer 56 may be formed using chemical vapor deposition (CVD), such as high density plasma chemical vapor deposition (HPDCVD) or a combination thereof. In other embodiments, the directional deposition process may be provided by ion beam sputtering, gas cluster ion beam (GCIB), or ion assisted deposition. The second spacer 56 can be composed of silicon nitride, however other dielectric materials, such as other nitrides, may be composed for the composition of the second spacer 56.

A planarized spacer 57 may be formed atop the second spacer 56. The planarized spacer 57 may have the same composition as the middle portion 50 of the multi-layered common spacer 46, 50, 51. For example, the planarized spacer 57 may be composed of an oxide, such as silicon oxide. In other embodiments, the planarized spacer 57 may be composed of a nitride, or any other suitable dielectric. The planarized spacer 57 may be formed using a deposition process, such as chemical vapor deposition (CVD). Following deposition, the material layer for the planarized spacer 57 may be planarized, e.g., planarized by chemical mechanical planarization (CMP), to provide that the upper surface of the planarized spacer 57 is coplanar with the upper surface of the conformal dielectric layer 40 that is present atop the mask 35.

Figure 3:
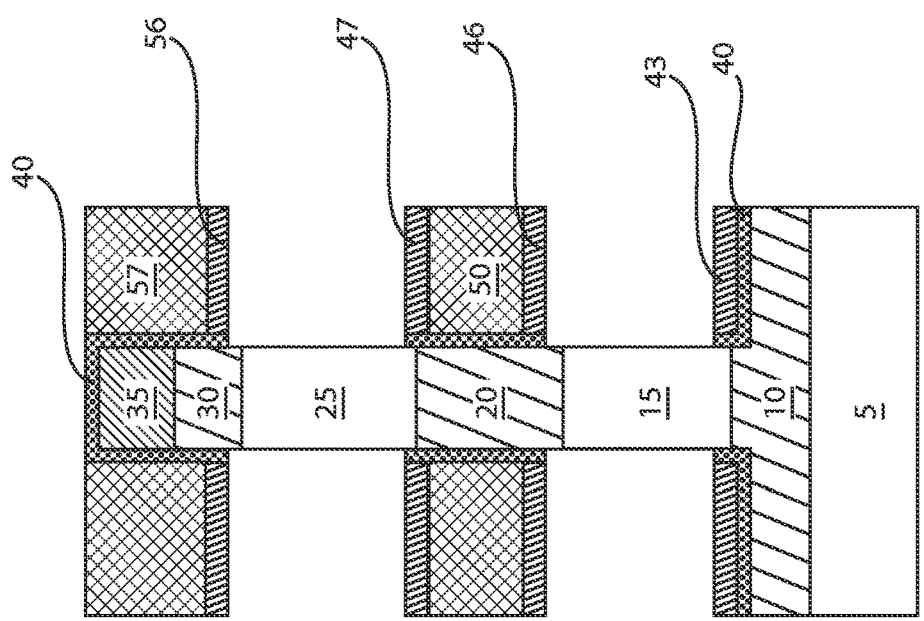
FIG. 3 is a side cross-sectional view of removing the sacrificial gate structures from the structure depicted in FIG. 2 to provide first and second gate openings to the first and second channel regions of the fin structure for the two vertically stacked transistors.

FIG. 3 depicts removing the sacrificial gate structures 45, 55 from the structure depicted in FIG. 2 to provide first and second gate openings 70, 75 to the first and second channel regions 15, 25 of the fin structure for the two vertically stacked transistors. Sacrificial gate structures 45, 55 may be removed by a selective etch process. The sacrificial gate structures 45, 55 and the portion of the conformal dielectric layer 40 that is present between the first and second channel regions 15, 25 may be removed by an etch process that is selective to the first and second channel regions 15, 25. The etch process may be a wet etch, gas etch and/or plasma etch.

Figure 4:
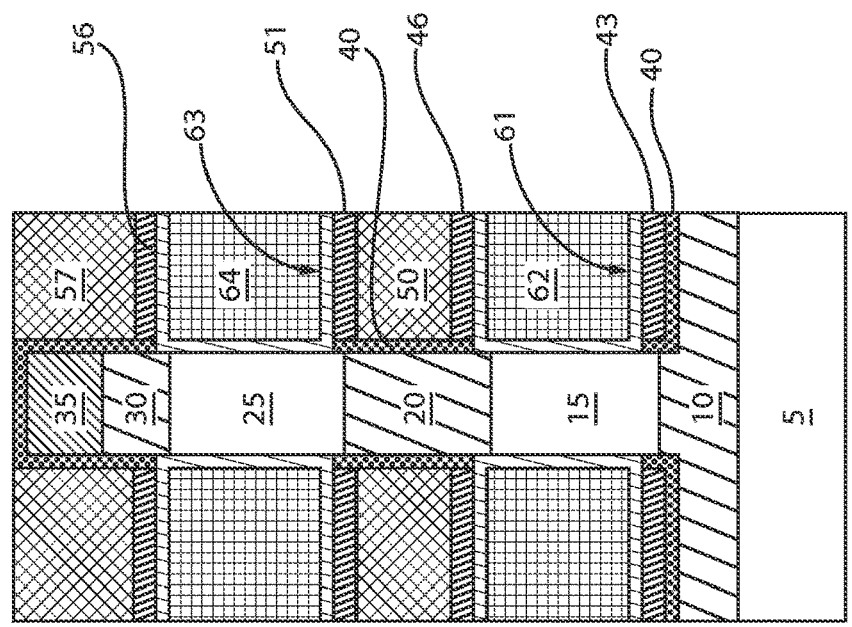
FIG. 4 is a side cross-sectional view depicting forming replacement gate structures in the first and second gate openings.

FIG. 4 depicts forming replacement first and second gate structures 60, 65 in the first and second gate openings 70, 75. In one example, the replacement first and second gate structures 60, 65 have a gate all around (GAA) geometry, in which the entirety of the channel regions of the first and second transistors that are stacked are surrounded by the gate structures 60, 65. The replacement first and second gate structures 60, 65 are functional gate structures that function to switch the semiconductor device from an "on" to "off" state, and vice versa.

Each of the first and second replacement gate structures 60, 65 may each include a gate dielectric 61, 63 and a gate electrode 62, 64. The gate dielectric 61, 63 is positioned between the gate electrode 62, 64 and the first and second channel regions 15, 25. The gate dielectric 61, 62 may be composed of any dielectric material, such as an oxide, nitride or oxynitride material. In some embodiments, the gate dielectric 61, 63 is a high-k dielectric material. As used herein, "high-k" denotes a dielectric material featuring a dielectric constant (k) higher than the dielectric constant of $SiO_2$ at room temperature. For example, the gate dielectric layer 61, 63 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric 61, 63 include hafnium silicate, hafnium silicon oxynitride or combinations thereof. In one embodiment, the gate dielectric 31 has a thickness ranging from about 1.0 nm to about 6.0 nm.

In some embodiments, the gate electrodes 62, 64 for the first and second gate structures 60, 65 may be composed of a metal, such as a high work function metal and/or a low work function metal. In one embodiment, the work function of the high work function metal layer ranges from 4.9 eV to 5.2 eV. In one embodiment, the high work function metal is composed of titanium nitride (TiN). In some embodiments, the high work function metal may be composed of TiAlN, Ru, Pt, Mo, Co and alloys and combinations thereof. In one embodiment, the work function of the low work function metal ranges from 4.1 eV to 4.3 eV. In one embodiment, the low work function metal is composed of at least one of TiAl, TaN, TiN, HfN, HfSi, or combinations thereof. In some other embodiments, the gate electrode (also referred to as gate conductor) 62, 64 may be composed of doped semiconductor, e.g., n-type polysilicon or p-type polysilicon.

FIG. 5 depicts one embodiment of forming a metal semiconductor alloy 80 that is present extending along a sidewall of the common source/drain region 20 extending from a first spacer on the first gate region to a second spacer on the second gate region. A "metal semiconductor alloy" is an alloy of at least one metal and at least on semiconductor material. The metal element of the metal semiconductor alloy 80 may be tantalum, titanium, tungsten, nickel and/or platinum. The semiconductor element of the metal semiconductor alloy 80 can be silicon and/or germanium. A silicide is a metal semiconductor alloy in which the semiconductor element is silicon. In some embodiments, the metal semiconductor alloy 80 may be a silicide selected from nickel silicide, nickel di-silicide, tungsten silicide, tantalum silicide and combinations thereof.

The process sequence for forming the metal semiconductor alloy 80 can begin with removing the middle portion 50 of the common spacer 46, 50, 51. The middle portion 50 of the common spacer 46, 50, 51 may be removed by a selective etch process. The etch process for removing the middle portion 50 of the common spacer 46, 50, 51 may also remove the portion of the conformal dielectric layer 40 that is present between the common source/drain region 20 and the middle portion 50 of the common spacer 46, 50, 51. The etch process for removing the middle portion 50 of the common spacer 46, 50, 51 and the conformal dielectric layer 40 may be selective to the semiconductor material of the common source/drain region 20. The etch process for removing the middle portion 50 of the common spacer 46, 50, 51 and the conformal dielectric layer 40 may be a gas etch, plasma etch and/or a wet chemical etch.

Following removing the middle portion 50 of the common spacer 46, 50 51 and the portion of the conformal dielectric layer 40 that is present on the common source/drain region 20, a metal layer is deposited on the exposed sidewall surface of the common source/drain region 20. The metal layer may be deposited using physical vapor deposition (PVD), e.g., sputtering, plating, electroplating, electroless plating, chemical vapor deposition (CVD) or a combination thereof. In a following step, an anneal process intermixes the metal elements from the metal layer and the semiconductor elements from the surface of the common source/drain region 20 to provide the metal semiconductor alloy 80. The anneal process may be rapid thermal annealing (RTA), laser annealing (LSA), furnace annealing or a combination thereof.

The metal semiconductor alloy 80 provides a low resistance pathway between the first and second vertical field effect transistors (VFETs).

It is noted that forming the metal semiconductor alloy 80 is optional, and that the metal semiconductor alloy 80 may be omitted.

FIG. 6 depicts forming a gate contact 85, contact to the drain region 86 and contact to the source region 87 of the device. In some embodiments, the gate contact 85 contacts both of the gate conductors 62, 64 for the first and second gate structures 60, 65 simultaneously. The contact to the drain region 86 may extend into direct contact with the second source/drain region 30. The contact to the source region 87 of the device may extend into direct contact with the second source/drain region 30.

Before forming the contacts 85, 86, 87, the mask 35 may be removed. In some embodiments, the mask 35 may be removed by an etch process, e.g., an etch process that is selective to the second source/drain region 30. An interlevel dielectric layer 80 may then be deposited encapsulating the structure depicted in FIG. 5.

Referring to FIG. 6, the interlevel dielectric layer 84 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H).

Via openings may then be formed through the interlevel dielectric layer 84 to expose portions of the gate structures 60, 65, the second source/drain region 30 and the first source/drain region 10. The vias may be formed by forming at etch mask, e.g., photoresist etch mask, atop the interlevel dielectric layer 84, and etching vias into the interlevel dielectric layer 84 using an anisotropic etch process, such as reactive ion etching (RIE).

To provide the contacts 85, 86, 87, an electrically conductive metal is deposited in the vias. The contacts 85, 86, 87 may be composed of any electrically conductive material, such as metals including copper (Cu), aluminum (Al), tungsten (W), platinum (Pt), titanium (Ti), silver (Ag) and combinations thereof. The electrically conductive material for the contacts 85, 86, 87 may be deposited using physical vapor deposition, e.g., sputtering, plating, electroplating, electroless plating and/or chemical vapor deposition (CVD).

The method described with reference to FIGS. 1-6 is a gate last process sequence. In another embodiment, the process sequence for forming the stack of vertical field effect transistors (VFETs) depicted in FIG. 6 is formed using a gate first process sequence, which is not depicted in the supplied figures. In one embodiment, a functional gate structure is formed instead of a replacement gate structure, and the functional gate structure remains throughout the formation of the fin structure. This is referred to as a gate first process sequence. Both gate first and gate last process sequences are applicable to the present disclosure.

Referring to FIG. 6, in one embodiment, the electrical device provided by the present disclosure includes a first vertical field effect transistor (VFET) including a first source/drain region 10 present on a supporting substrate 5, a first channel region 15 in direct contact with the first source/drain region 10 and a common source/drain region 20. The electrical device also includes a second vertical field effect transistor (VFET) stacked atop the first vertical field effect transistor (VFET). The second vertical field effect transistor includes the common source/drain region 20, a second channel region 15 present on the common/source drain region 25, and a second source/drain region 30 present on the second channel region 15. The first and second vertical field effect transistors (VFETs) are vertically stacked upon one another so that the first channel region 15, the common source/drain region 20, the second channel region 25 and the second source/drain region 30 are present within a fin structure. The first source/drain region 10 is present underlying the fin structure, and is provided by a layer atop the supporting substrate 5, wherein the first source/drain region 10 has a greater width than the fin structure. As illustrated in FIG. 6, the first and second vertical field effect transistors are connected by the common source/drain region 20. In some embodiments, the first vertical field effect transistor and the second vertical field effect transistor are connected in series across the common source/drain region 20.

In one embodiment, the electrical device further includes a metal semiconductor alloy 80 that is present on a sidewall of the common source/drain region 20. The metal semiconductor alloy 80 may extend along an entirety of the sidewall of the common source/drain region 20 extending from a gate sidewall spacer, i.e., upper spacer 51, of the second gate structure 65, to the gate sidewall spacer, i.e., lower spacer 46, of the first gate structure 60. In some embodiments, the first and second vertical field effect transistors are connected by the common source/drain region 20, and the metal semiconductor alloy 80 provides an electrical path between the first and second vertical field effect transistors that has a resistance lower when compared to a pathway directly through the common source/drain region 20 without the metal semiconductor alloy 80.

Figure 7:
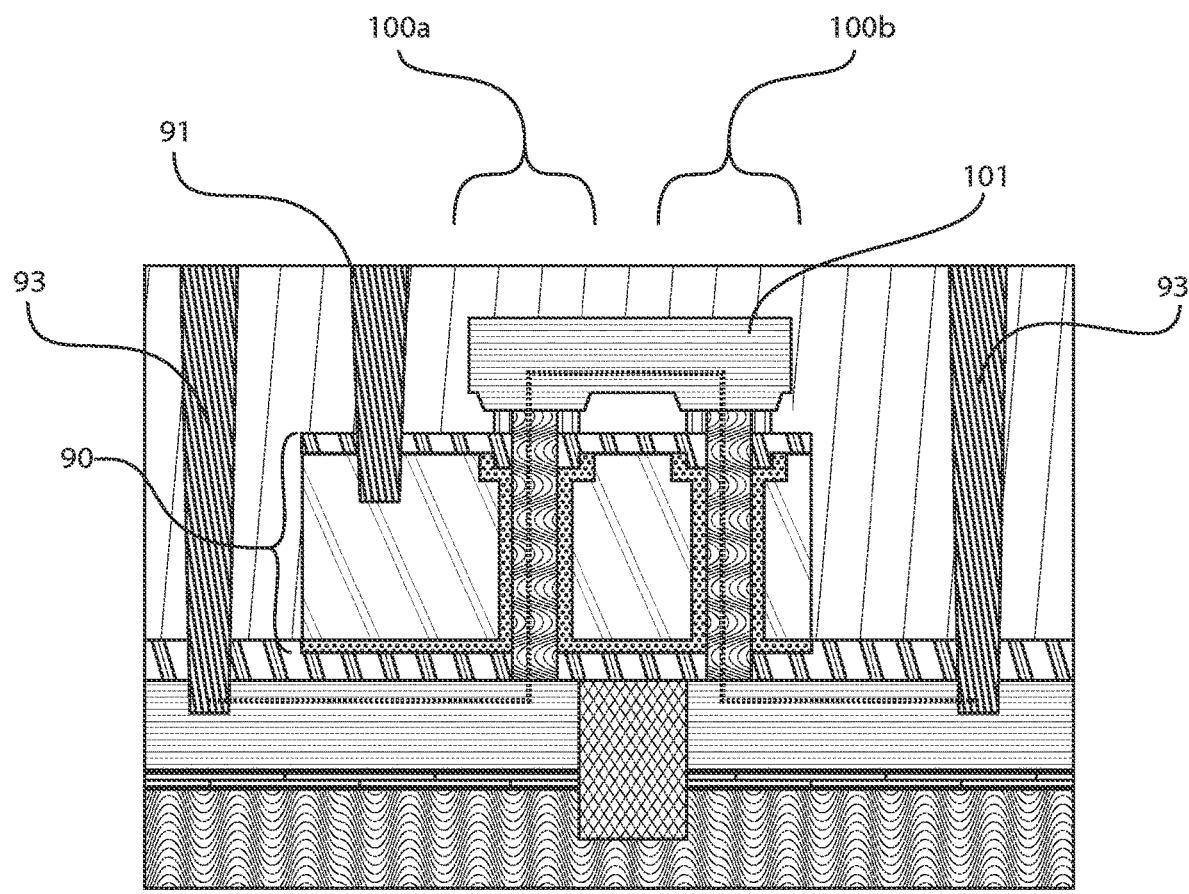
FIG. 7 is a side cross-sectional view of two sets of vertically stacked field effect transistors adjacent to one another on the same supporting substrate.

FIG. 7 depicts two sets of vertically stacked field effect transistors 100a, 100b adjacent to one another on the same supporting substrate 5. Each set of vertically stacked field effect transistor 100a, 100b may be provided by the structure depicted in FIG. 6, and formed using the method described with reference to FIGS. 1-6. A common gate structure 90 may be in direct contact with the gate structures of the first and second vertical field effect transistors (VFETs) in each of the first and second sets of vertically stacked field effect transistors 100a, 100b. The second source/drain region for each of the two sets of vertically stacked field effect transistors 100a, 100b may be connected by a doped semiconductor material, e.g., heavily doped p-type epitaxial semiconductor material. A gate contact 91 is present extending through an interlevel dielectric layer into direct contact with the common gate structure 90. Contacts 93 also extend through the interlevel dielectric layer to the first source/drain regions for each of the two sets of vertically stacked field effect transistors 100a, 100b may be connected by a doped semiconductor material.

Having described preferred embodiments of series connected stacked vertical transistors for high voltage applications, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrical device comprising:
 a first vertical field effect transistor (VFET) including a first source/drain region present on a supporting substrate, a first channel region in direct contact with the first source/drain region and a common source/drain region;
 a second vertical field effect transistor including the common source/drain region, a second channel region present on the common/source drain region, and a second source/drain region present on the second channel region, wherein the first and second vertical field effect transistors (VFETs) are vertically stacked upon one another the first channel region, the common source/drain region, the second channel region and the second source/drain region present within a fin structure, the first and second vertical field effect transistors being connected by the common source/drain region; and
 a gate contact is in direct contact with each of a first gate structure to the first channel region of the first vertical field effect transistor and a second gate structure to the second channel region of the second vertical field effect transistor.

2. The electrical device of claim 1, wherein the first source/drain region is a layer atop the supporting substrate having a greater width than the fin structure.

3. The electrical device of claim 1, wherein the first vertical field effect transistor and the second vertical field effect transistor are connected in series across the common source/drain region.

4. The electrical device of claim 1, wherein a drain contact is in direct contact with the second source/drain region, a source contacts is in direct contact with the first source/drain region.

5. The electrical device of claim 1, wherein each of the first source/drain region, the common source/drain region and the second source/drain region have a same conductivity type.

6. The electrical device of claim 1, wherein a first gate structure is present on the first channel region, and the first gate structure has a gate all around (GAA) structure.

7. The electrical device of claim 1, wherein a second gate structure is present on the second channel region, and the second gate structures has a gate all around (GAA) structure.

8. The electrical device of claim 1, wherein a first channel sidewall for the first channel region is aligned with a second channel sidewall for the second channel region.

9. An electrical device comprising:
 a first vertical field effect transistor (VFET) including a first source/drain region present on a supporting substrate, a first channel region in direct contact with the first source/drain region and a common source/drain region;
 a second vertical field effect transistor including the common source/drain region, a second channel region present on the common/source drain region, and a second source/drain region present on the second channel region, wherein the first and second vertical field effect transistors (VFETs) are vertically stacked upon one another the first channel region, the common source/drain region, the second channel region and the second source/drain region present within a fin structure, wherein the first and second vertical field effect transistors are connected by the common source/drain region; and a metal semiconductor alloy present on a sidewall of the common source/drain region wherein the metal semiconductor alloy provides an electrical path between the first and second vertical field effect transistors having a resistance lower than a pathway directly through the common source/drain region without the metal semiconductor alloy.

10. The electrical device of claim 9, wherein the first source/drain region is a layer atop the supporting substrate having a greater width than the fin structure.

11. The electrical device of claim 9, wherein the first vertical field effect transistor and the second vertical field effect transistor are connected in series across the common source/drain region.

12. The electrical device of claim 9, wherein a drain contact is in direct contact with the second source/drain region, a source contacts is in direct contact with the first source/drain region, and a gate contact is in direct contact with each of a first gate structure to the first channel region of the first vertical field effect transistor and a second gate structure to the second channel region of the second vertical field effect transistor.

13. The electrical device of claim 9, wherein each of the first source/drain region, the common source/drain region and the second source/drain region have a same conductivity type.

14. The electrical device of claim 9, wherein a first gate structure is present on the first channel region, and the first gate structure has a gate all around (GAA) structure.

15. The electrical device of claim 9, wherein a second gate structure is present on the second channel region, and the second gate structures has a gate all around (GAA) structure.

16. The electrical device of claim 9, wherein a first channel sidewall for the first channel region is aligned with a second channel sidewall for the second channel region.

17. An electrical device comprising:

a first semiconductor device including a first source/drain region present on a supporting substrate, a first channel region in direct contact with the first source/drain region and a common source/drain region;

a second semiconductor device including the common source/drain region, a second channel region present on the common/source drain region, and a second source/drain region present on the second channel region, wherein the first and second semiconductor devices are vertically stacked upon one another the first channel region, the common source/drain region, the second channel region and the second source/drain region present within a fin structure, the first and second vertical field effect transistors being connected by the common source/drain region to provide that the first semiconductor device and the second semiconductor device are connected in series; and a gate contact in direct contact with each of a first gate structure to the first channel region of the first semiconductor device and a second gate structure to the second channel region of the second semiconductor device.

18. The electrical device of claim 17, wherein a drain contact is in direct contact with the second source/drain region, a source contacts is in direct contact with the first source/drain region.

19. The electrical device of claim 17, wherein each of the first source/drain region, the common source/drain region and the second source/drain region have a same conductivity type.

* * * * *